(12) United States Patent
Raad et al.

(10) Patent No.: US 10,930,326 B2
(45) Date of Patent: Feb. 23, 2021

(54) SENSING ARCHITECTURE

(71) Applicant: Micron Technology, Inc., Boise, ID (US)

(72) Inventors: George B. Raad, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,916

(22) Filed: Dec. 26, 2018

(65) Prior Publication Data

US 2020/0211604 A1 Jul. 2, 2020

(51) Int. Cl.
*G11C 11/00* (2006.01)
*G11C 7/08* (2006.01)
*G11C 7/10* (2006.01)
*G11C 7/06* (2006.01)

(52) U.S. Cl.
CPC ............... *G11C 7/08* (2013.01); *G11C 7/062* (2013.01); *G11C 7/1015* (2013.01); *G11C 7/1069* (2013.01)

(58) Field of Classification Search
CPC .................................................... G11C 7/062
USPC ................................ 365/185.207, 205, 207
See application file for complete search history.

(56) References Cited

U.S. PATENT DOCUMENTS

| | | | | |
|---|---|---|---|---|
| 2005/0254282 A1* | 11/2005 | Summerfelt | ........... | G11C 5/147 365/145 |
| 2006/0018158 A1* | 1/2006 | Jo | ......................... | G11C 16/16 365/185.11 |
| 2010/0188882 A1* | 7/2010 | Kang | ................... | G11C 7/1021 365/145 |
| 2012/0307545 A1* | 12/2012 | McAdams | ............ | G11C 11/221 365/145 |
| 2013/0155773 A1* | 6/2013 | Miyamoto | ............. | G11C 16/06 365/185.12 |
| 2018/0033467 A1* | 2/2018 | Villa | ........................ | G11C 8/16 |
| 2019/0214092 A1* | 7/2019 | Jang | ...................... | G11C 11/413 |

* cited by examiner

*Primary Examiner* — Hoai V Ho
(74) *Attorney, Agent, or Firm* — Holland & Hart LLP

(57) ABSTRACT

Devices and methods for a sensing scheme are described. A device may include a memory array and a column select line configured to couple with a single page of a set of pages within the memory array when the single page is selected during an access operation. The column select line may be isolated from other pages (e.g., unselected pages) of the set. The device may include a set of sense component groups coupled with the single page. Each sense component group of the set may be configured to access one or more memory cells of the single page using the column select line. The device may include a decoding component configured to couple a sense component group of the set with an I/O line of an I/O channel. The device may communicate information with the I/O line during the access operation.

26 Claims, 8 Drawing Sheets

SENSING ARCHITECTURE

BACKGROUND

The following relates generally to operating a memory device and more specifically to a sensing architecture.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the electronic device may read, or sense, at least one stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source. Non-volatile memory, e.g., FeRAM, may maintain their stored logic state for extended periods of time even in the absence of an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Improving an efficiency (e.g., less power consumption, improved sensing accuracy) of a sensing component of memory devices may also be desired.

DETAILED DESCRIPTION

Figure 1:
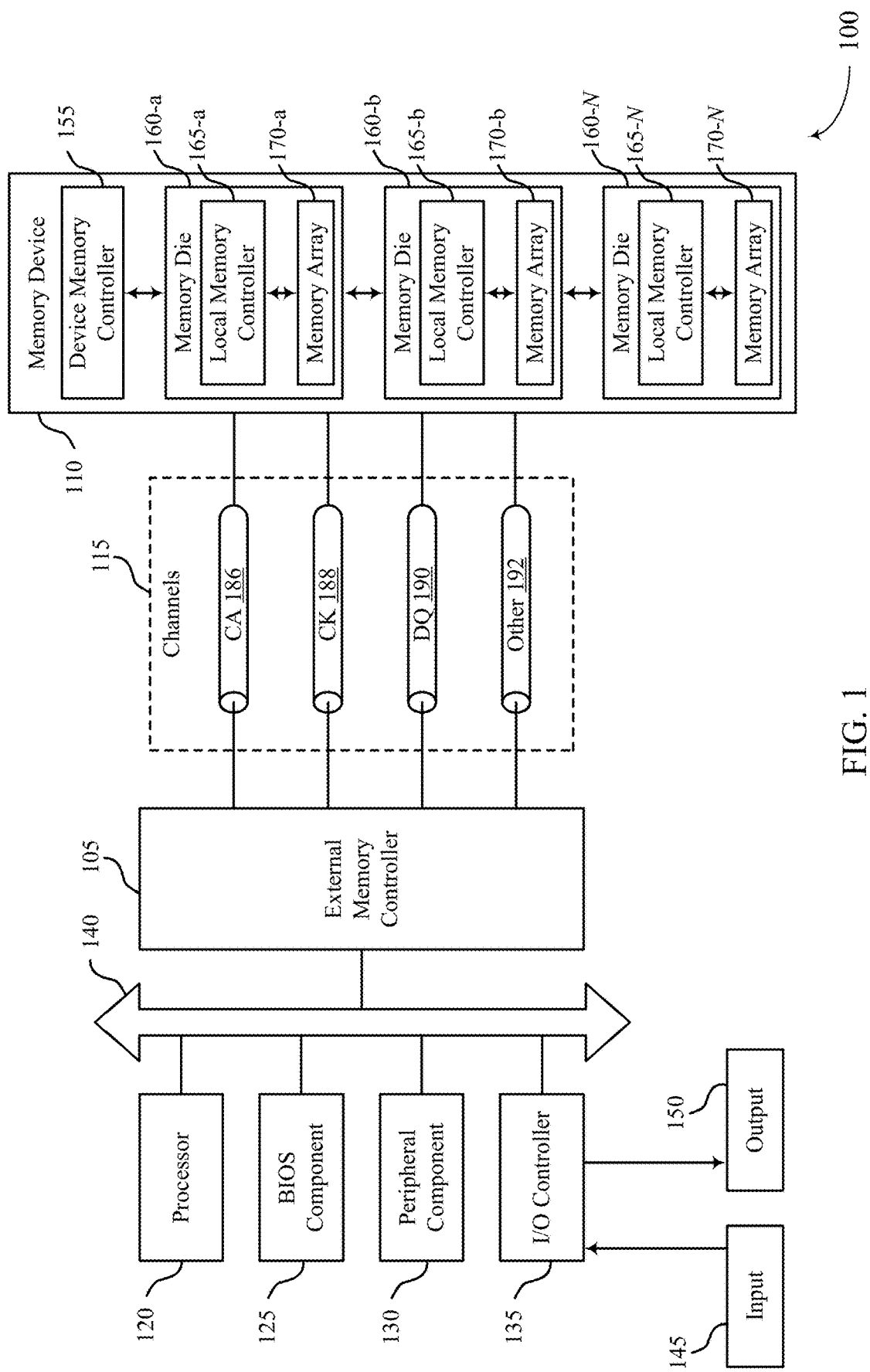
FIG. 1 illustrates an example of a system that supports a sensing architecture in accordance with aspects of the present disclosure.

In some memory devices, a memory cell may be configured to store multiple states (e.g., more than one bit of digital data). Accurate sensing of the memory cell may become difficult as a quantity of possible states that can be stored by the memory cell increases and thereby increasing a number of bits per memory cell (e.g., a multi-level cell). To improve the sensing of a multi-level memory cell during various phases of a read operation a node a charge transfer device may be configured to transfer charge between a node of the sense component and the digit line. As part of the operation of the charge transfer device, a sense component may be precharged to different voltages using a switching component (e.g., transistor) during a portion of the read operation. Additionally, the switching component may be configured to couple the node of the sense component with an input/output (I/O) line during a different portion of the read operation. As such, the switching component may perform two or more functions during the read operation to achieve a compact layout of overall sensing circuitry.

In this manner, activating the switching component for one function (e.g., coupling the node to the I/O line) may couple the node of the sense component with additional components that may be used for another function (e.g., components associated with the charge transfer operation). Reducing a quantity of components coupled to the node when the switching component is activated may be desirable because the additional components coupled to the node may result in various undesirable effects, such as increased power consumption during an access operation to access (e.g., read or write) a targeted section of a memory array, disturbance to untargeted sections of the memory array, and the like.

A sensing architecture is described to support a sensing scheme that includes a multi-functional switching component (e.g., a column select device) that mitigates at least some of the various undesirable effects. In the sensing architecture, the multi-functioning switching component may be activated by a line (e.g., column select line) that may be coupled with a targeted section (e.g., an activated page) of a memory array during an access operation (e.g., read operation, write operation). The line (e.g., column select line) may be dedicated to the targeted section. As such, in some cases, the line may be isolated from other untargeted sections of the memory array. Such a configuration may isolate various components associated with the remaining sections of the memory array from the targeted section during the access operation. In other words, the line (e.g., the column select line) may be configured in such a way that the targeted section (e.g., the activated page) may be isolated from the remaining sections (e.g., inactive sections, non-target sections) of the memory array during an access operation.

A memory device that supports the sensing architecture may include a memory array including a set of pages that each include a memory cell. The memory device may also include a column select line that is configured to couple with a single page of the set of pages based on the single page being accessed during an access operation. The memory device may also include a set of sense component groups coupled with the single page of the set of pages, where each sense component group of the set of sense component groups may be configured to access the memory cell of the single page using the column select line. In some cases, the memory device may include a decoding component configured to couple a sense component group of the set of sense component groups with an I/O line of an I/O channel.

A controller of the memory device may select a target page from a set of pages of a memory array for an access operation. The controller may bias, based on selecting the target page, a column select line to activate a switching component (e.g., a first transistor) coupled with a sense component group of the target page, where the column select line may be coupled with the target page. The controller may also bias, based on biasing the column select line, an output select line to activate a decoding component (e.g., a second transistor of the decoding component) that may be configured to selectively couple the switching component (e.g., the first transistor) with an I/O line. In some cases, the controller may couple the sense component group of a set of sense component groups with the I/O line of a set of I/O lines based on biasing the column select line and biasing the output select line.

Features of the disclosure are initially described in the context of a memory system. Then, features of the disclosure are described in the context of a memory die, a circuit diagram, and block diagrams that support a sensing architecture in accordance with aspects of the present disclosure. These and other features of the disclosure are further illustrated by and described with reference to an apparatus diagram and flowcharts that relate to sensing architectures.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least some portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic I/O system (BIOS) component 125, one or more peripheral components 130, and an I/O controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component (s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some cases, the memory device 110 or the memory die 160 may include a plurality of pages that each include a memory cell, a column select line that may be configured to couple with a single page of the plurality of pages based at least in part on the single page being accessed, and a plurality of sense component groups coupled with the single page of the plurality of pages, where each sense component group of the plurality of sense component groups may be configured to access the memory cell of the single page using the column select line. In some cases, the memory device 110 or the memory die 160 may further include a decoding component configured to couple a sense component group of the plurality of sense component groups with an I/O line of an I/O channel. In some cases, the I/O line of the I/O channel may be configured to couple with a voltage source to precharge a node of the single page during a read operation.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120.

In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

In some cases, a controller (e.g., a local memory controller 165) may select a target page from a plurality of pages of a memory array (e.g., memory array 170) for an access operation. The controller may bias, based on selecting the target page, a column select line to activate a first transistor (e.g., a switching component or a column select transistor) coupled with a sense component group of the target page, where the column select line may be coupled with the target page and not coupled with the other pages (e.g., non-targeted pages) of the memory array. Also, the controller may bias, based on biasing the column select line, an output select line to activate a second transistor (e.g., a transistor of a decoding component) that may be configured to selectively couple the first transistor with an I/O line. Subsequently, the controller may communicate information with the I/O line during the access operation based on biasing the column select line and biasing the output select line.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data (DQ) channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended.

In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate (e.g., bi-directional) information to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may, optionally, include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
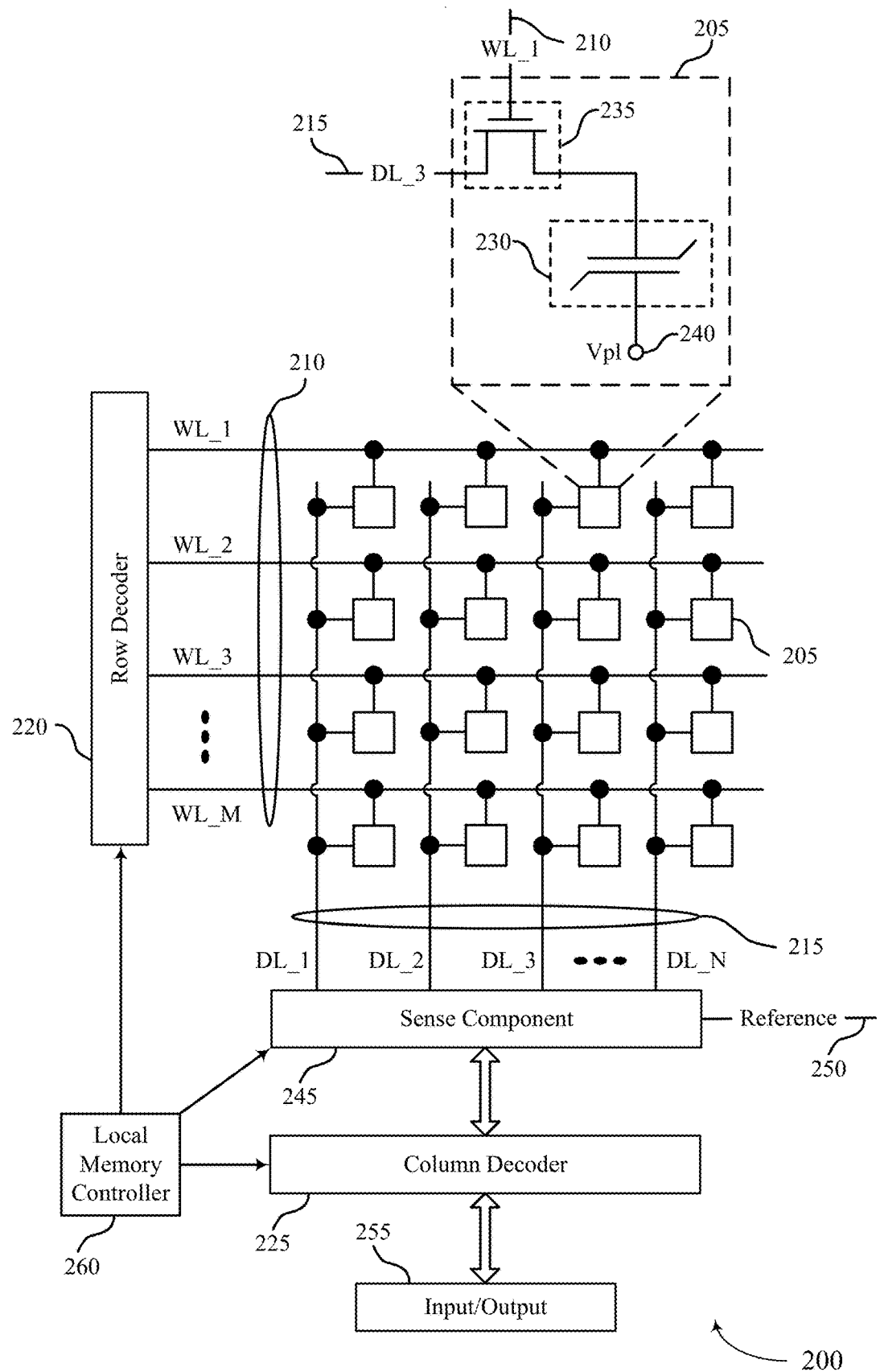
FIG. 2 illustrates an example of a memory die that supports a sensing architecture in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. As used herein, a charge refers to an amount of charge present in or on a component or a conductor and is not limited to a particular value carried by a single proton or electron. DRAM architectures may include a capacitor (e.g., a capacitor 230) that includes a dielectric material to store a charge representative of the programmable state. In some examples, the memory cell 205 may be coupled with a sense component 245 via a digit line 215. In some examples, the digit line 215 may be coupled with a charge transfer component that may be configured, during a read operation, to transfer a charge between the digit line 215 and a node of the sense component 245. In some cases, the charge transfer component may include one or more transistors, a capacitor, or both.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 and a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a cell switching component 235. The capacitor 230 may be an example of a dielectric capacitor or a ferroelectric capacitor. A first node of the capacitor 230 may be coupled with the cell switching component 235 and a second node of the capacitor 230 may be coupled with a voltage source 240. In some cases, the voltage source 240 may be the cell plate reference voltage, such as Vpl. In some cases, the voltage source 240 may be an example of a plate line coupled with a plate line driver. The cell switching component 235 may be an example of a transistor or any other type of switch device that selectively establishes or de-establishes electronic communication between two components.

Selecting or deselecting the memory cell 205 may be accomplished by activating or deactivating the cell switching component 235. The capacitor 230 may be in electronic communication with the digit line 215 using the cell switching component 235. For example, the capacitor 230 may be isolated from digit line 215 when the cell switching component 235 is deactivated, and the capacitor 230 may be coupled with digit line 215 when the cell switching component 235 is activated. In some cases, the cell switching component 235 is a transistor and its operation may be controlled by applying a voltage to the transistor gate, where the voltage differential between the transistor gate and transistor source may be greater or less than a threshold voltage of the transistor. In some cases, the cell switching component 235 may be a p-type transistor or an n-type transistor. The word line 210 may be in electronic communication with the gate of the cell switching component 235 and may activate/deactivate the cell switching component 235 based on a voltage being applied to the word line 210.

A word line 210 may be a conductive line in electronic communication with a memory cell 205 that is used to perform access operations on the memory cell 205. In some architectures, the word line 210 may be in electronic communication with a gate of a cell switching component 235 of a memory cell 205 and may be configured to control the cell switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the cell switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. The digit line 215 may be coupled with a charge transfer component, which may be coupled with a node of the sense component 245.

The sense component 245 may be configured to detect a charge stored on the capacitor 230 of the memory cell 205 and determine a logic state of the memory cell 205 based on the stored charge. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change.

The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals.

The detected logic state of memory cell 205 may be output through column decoder 225 as output 255. In some cases, the sense component 245 may be part of another component (e.g., a column decoder 225, a row decoder 220). In some cases, the sense component 245 may be in electronic communication with the row decoder 220 or the column decoder 225. In some examples, a node of the sense component 245 may, through a switching component (e.g., a first transistor), be coupled with an I/O line during an access operation (e.g., read operation, write operation). In some examples, a decoding component may be configured to couple the node of the sense component 245 with an I/O line of an I/O channel during the access operation.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, a memory array may include a set of pages and a controller coupled with the memory array. The controller may be configured to cause the apparatus to select a target page from the set of pages of the memory array for an access operation. The controller may cause the apparatus to bias, based on selecting the target page, a column select line to activate a first transistor coupled with a sense component group of the target page, where the column select line may be coupled with the target page. The controller may also cause the apparatus to bias, based on biasing the column select line, an output select line to activate a second transistor that is configured to selectively couple the first transistor with an I/O line and communicate information with the I/O line during the access operation based on biasing the column select line and biasing the output select line.

Figure 3:
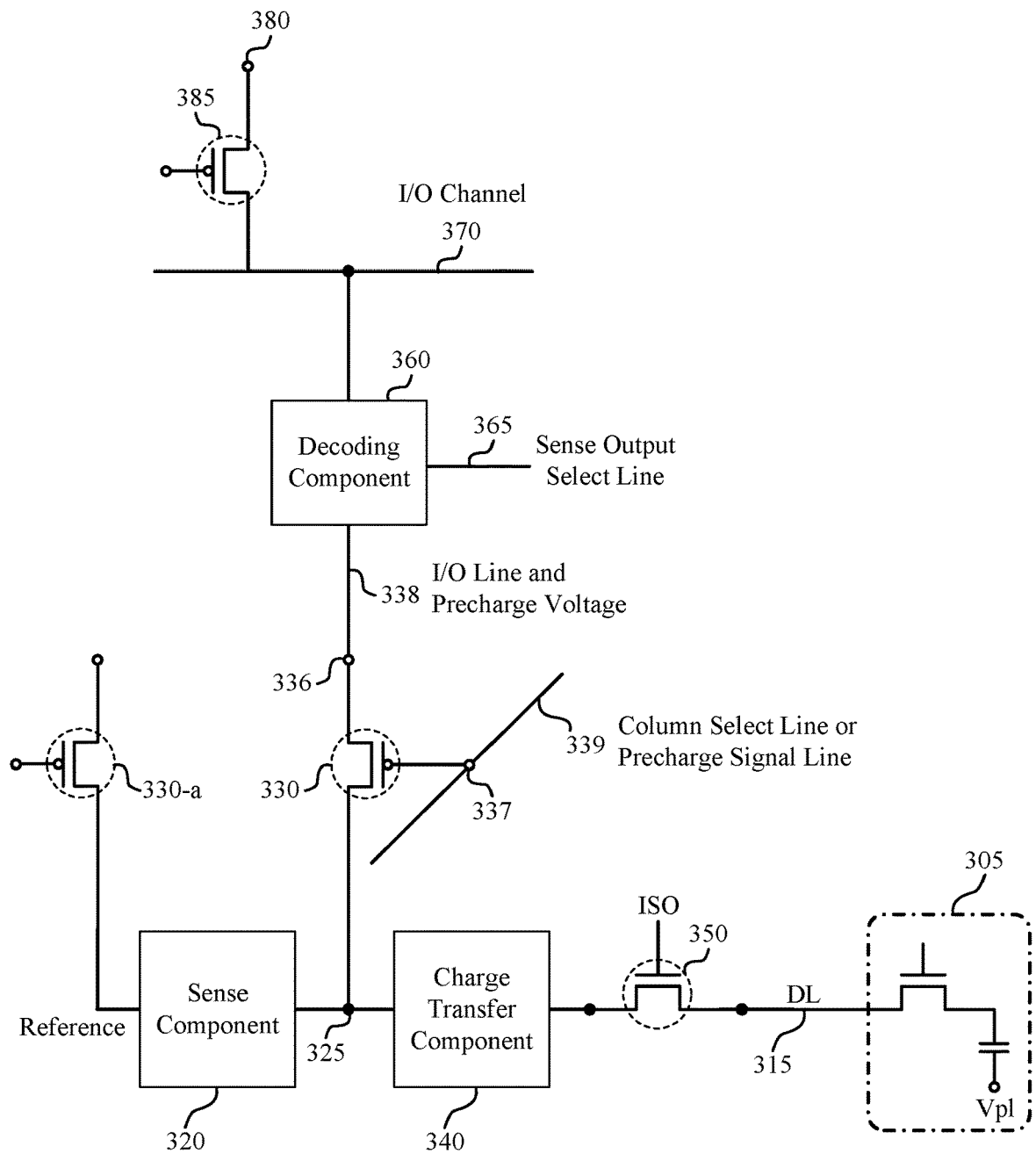
FIG. 3 illustrates an example of a circuit that supports a sensing architecture in accordance with aspects of the present disclosure.

FIG. 3 illustrates a circuit 300 that supports a sensing architecture in accordance with aspects of the present disclosure. The circuit 300 illustrates how a multi-functional switching component may couple a node of a sense component with a voltage source during a first portion of a read operation and couple the node with an I/O line during a second portion of an access operation (e.g., read operation, write operation). The circuit 300 may include one or more components described herein with reference to FIGS. 1 and 2. For example, the circuit 300 may include a memory cell 305, which may be an example of memory cell 205 as described with reference to FIG. 2; a digit line 315, which may be an example of digit line 215 as described with reference to FIG. 2; a sense component 320, which may be an example of sense component 245 as described with reference to FIG. 2; a node 325 associated with the sense component 320 (which may be referred to as a true node of sense component 320); a multi-functional switching component 330 (and 330-*a* coupled with reference node (which may be referred to as a complimentary node) of the sense component 320); a first node 336; a second node 337; a charge transfer component 340; an isolation device 350; a decoding component 360; sense output select line 365; and an I/O channel 370, which may be an example of DQ channel 190 as described with reference to FIG. 1. In some examples, the multi-functional switching component 330 may be referred to as a first transistor or a column select transistor.

The multi-functional switching component 330 may include a p-type field-effect transistor (FET) as depicted in the circuit 300, but may be an n-type FET or a combination of both p-type and n-type FETs, in some examples. The multi-functional switching component 330 may be configured to couple the node 325 with the first node 336. The first node 336 may be coupled with a first line 338. The first line 338 may be an I/O line (e.g., an I/O line of I/O channel 370 through decoding component 360) or a precharge voltage based on different phases of an access operation (e.g., read operation, write operation). The second node 337 (e.g., a gate of the p-type FET of the multi-functional switching component 330) may be coupled with a second line 339. The second line 339 may be a column select line during an access operation or a precharge signal line during a read operation.

As such, the multi-functional switching component 330 may be activated (e.g., by biasing the column select line 339 during the access operation) to couple the node 325 (e.g., the node 325 associated the sense component 320) with an I/O line during some durations of the access operation. Additionally, the multi-functional switching component 330-*a* may be activated during some durations of the access operation to couple the reference node of sense component 320 to an I/O* line that may be configured to transfers a signal complimentary to the signal transferred by the I/O line. In some cases, the true signal and the complimentary signal may be part of a differential signaling scheme. The I/O line may be configured to transfer a signal associated with a logic state of a memory cell 305 (e.g., the logic state of the memory cell 305 included in the sense component 320) to another component (e.g., an external memory controller 105 as described with reference to FIG. 1). Alternatively or additionally, the multi-functional switching component 330 may be activated (e.g., by biasing the precharge signal line 339 during a read operation) to couple the node 325 (e.g., the node 325 associated with the charge transfer component 340) to a precharge voltage 380 (e.g., an output of a voltage source that may be configured to provide various precharge voltages via a switching component 385, in some cases) during a portion of a read operation. In this manner, the multi-functional switching component 330 may serve at least two functions as described herein. Namely, the multi-functional switching component 330 may couple the node 325 with the I/O line or with the precharge voltage based on an access operation or different phases of a read operation. Further, the multi-functional switching component 330 may be configured to decouple or isolate the node 325 from the first node 336 (e.g., either an I/O line or a precharge voltage) during some durations of the read operation.

The circuit 300 may include the isolation device 350 coupled with the charge transfer component 340 and the digit line 315. The isolation device 350 may be configured to isolate the charge transfer component 340 from the digit line 315 when deactivated during the read operation and couple the charge transfer component 340 with the digit line 315 when activated.

The circuit 300 may include the decoding component 360 coupled with the first node 336. The decoding component 360 may be configured to couple the sense component 320 with an I/O line of the I/O channel 370 when the multi-functional switching component 330 is activated based on biasing the column select line (e.g., the second line 339 during an access operation). The decoding component 360 may include at least one transistor (which may also be referred to as a second transistor or a link transistor in some cases) configured to selectively couple the sense component 320 with the I/O line of the I/O channel 370 based on biasing a sense output select line 365.

As described herein, activating the multi-functional switching component 330 during an access operation (e.g., by biasing a second line coupled with the multi-functional switching component 330) to couple the sense component 320 with an I/O line—e.g., I/O line 338 through the node 336—may also couple additional components with the node 336 due to the configuration of the multi-functional switching component 330. Such additional components may include parasitic elements (e.g., parasitic capacitances) and may result in undesirable effect during the access operation, for example, additional power consumption or disturbances on untargeted sections of the memory array. If the column select line is configured to activate other multi-functional switching components associated with memory cells of remaining sections (e.g., inactive sections, un-target sections) of the memory array, then the undesired effect may be exacerbated. Thus, a column select line (e.g., second line 339 during an access operation) may be coupled with a single section of the memory array that is being accessed and may be isolated from remaining sections of the memory array.

Figure 4:
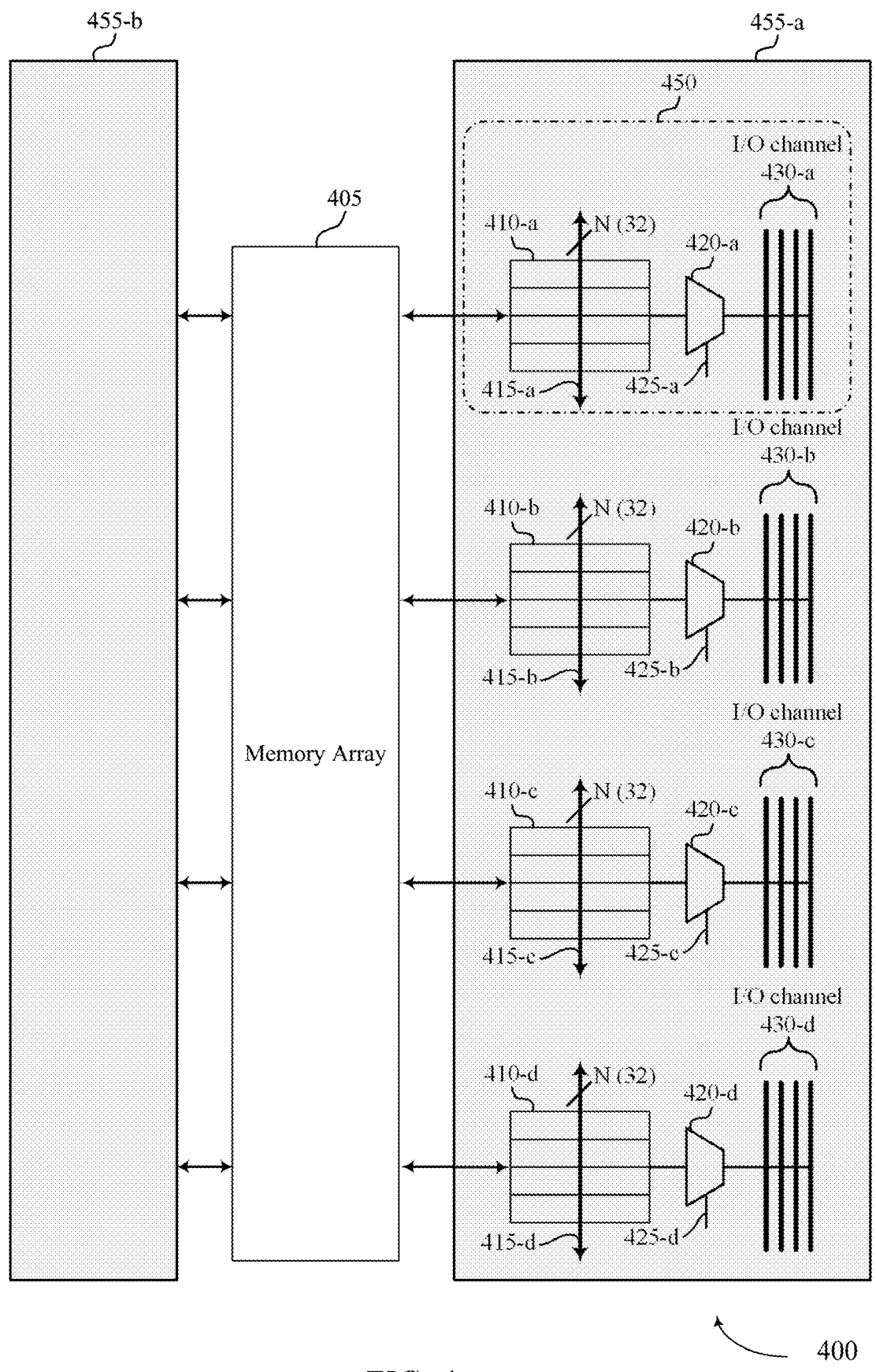
FIGS. 4 and 5 illustrate example diagrams that support a sensing architecture in accordance with aspects of the present disclosure.

FIG. 4 illustrates an example diagram 400 that supports a sensing architecture in accordance with aspects of the present disclosure. The diagram 400 illustrates an overall arrangement of various components for accessing a memory array during an access operation. The diagram 400 may include aspects of a memory die 200 described with reference to FIG. 2 and illustrate accessing a section of the memory array that may include a set of sections. In some cases, each section of the set may correspond to 512 bytes of data. In some cases, a section may be referred to as a page of data. In some cases, a section may be output in four (4) portions of 128 bytes and such construction of a set of data (e.g., total of 512 bytes of data in four (4) portions that each correspond to 128 bytes of data) may be referred to as a x4 scheme. The diagram 400 representing an output of 512 bytes of data under a x4 scheme is an example to illustrate aspects of the sensing architecture, although the disclosure herein is not limited to such example.

The diagram 400 may include one or more components described herein with reference to FIGS. 1 through 3. For example, the diagram 400 may include a memory array 405, which may be an example of a memory array of the memory die 200 that includes one or more memory cells 205 as described with reference to FIG. 2; sense component clusters 410, which may include aspects of sense component 245 or sense component 320 as described with reference to FIG. 2 or FIG. 3; column select lines 415, which may include aspects of column select line (e.g., second line 339 during an access operation) as described with reference to FIG. 3; decoding components 420, which may include aspects of decoding component 360 as described with reference to FIG. 3; sense output select lines 425, which may include aspects of sense output select line 365 as described with reference to FIG. 3; and I/O channels 430, which may include aspects of I/O channel 370 as described with reference to FIG. 3.

In some cases, a memory array may include interleaved digit lines and data may be output on both sides of the memory array. By way of example, the diagram 400 illustrates two data output units (e.g., data output unit 455-a, data output unit 455-b) on both sides of memory array 405. Each data output unit 455 may include four (4) component groups 450 that each include a sense component cluster (e.g., sense component cluster 410-a), column select lines (e.g., column select lines 415-a), a decoding component (e.g., decoding component 420-a), sense output select lines (e.g., sense output select lines 425-a), and an I/O channel (e.g., I/O channel 430-a). Each component group 450 may be configured to output 64 bytes of data such that 512 bytes of data may be output under the x4 scheme—e.g., a page of 512 bytes of data in eight (8) portions that each correspond to 64 bytes of data. In some cases, column select lines 415 (e.g., column select lines 415-a, column select lines 415-b, column select lines 415-c, column select lines 415-d) may be coupled together such that a set of column select lines (e.g., a set of 32 column select lines) may be routed over sense component clusters 410.

The memory array 405 may include a set of pages that each include a memory cell (e.g., memory cell 205 described with reference to FIG. 2, memory cell 305 described with reference to FIG. 3). In some cases, a page (e.g., a target page) of the set of pages may be activated for an access operation while remaining pages (e.g., non-target pages) of the set of pages may be un-activated during the access operation. In other words, the remaining pages are untargeted pages that are not accessed during an access operation.

Sense component clusters 410 may include one or more sense component groups (e.g., four (4) sense component groups as depicted in the diagram 400). Each sense component group may include a plurality of sense component blocks that each include a plurality of sense components (e.g., sense component 320). As described herein, each sense component may include a logic state of a memory cell (e.g., memory cell 305) and may be coupled with an I/O line of an I/O channel (e.g., I/O channel 430) when a multi-functional switching component (e.g., multi-functional switching component 330) is activated by biasing a column select lines (e.g., second line 339 during an access operation) that is coupled to the multi-functional switching component.

Column select lines 415 may include multiple column select lines. In some examples, column select lines 415 (e.g., column select lines 415-a, 415-b, 415-c, or 415-d) may include thirty-two (32) column select lines as depicted in the diagram 400 of accessing a page of 512 bytes. In other words, column select lines 415-a may include multiple column select lines (e.g., thirty-two (32) column select lines) that may activate multi-functional switching components configured to couple sense components associated with a desired quantity of memory cells (e.g., 128 bytes of memory cells) with I/O lines of I/O channel 430-a. In some cases, all of the multiple column select lines (e.g., thirty-two (32) column select lines) may be biased simultaneously to output a desired quantity of data (e.g., 128 bytes). In other cases, a selected subset of the multiple column select lines may be biased at a time such that all of the multiple column select lines are biased at any given time to collectively output a desired quantity of data (e.g., 128 bytes). Further, the column select lines (e.g., column select lines 415-*a*, 415-*b*, 415-*c*, 415-*d*) may be configured to couple with a single page (e.g., target page including 512 bytes of data) of the set of pages based on the single page being accessed during an access operation.

In some cases, a first set of column select lines (e.g., a first total of 64 column select lines as depicted in the diagram 400, namely a set of 32 continuous column select lines on each side of memory array 405) may be configured to couple with a first page (e.g., first 512 bytes of data) of the set of pages. In some cases, two sets of 32 continuous column select lines for a given page (e.g., two sets of 32 continuous column select lines included in the first total of 64 column select lines) may be generated and routed separately (e.g., due to layout constraints) although the two sets of 32 continuous column select lines are electrically identical. The first set of column select lines may be dedicated to the first page and therefore may be exclusive of remaining pages of the set of pages. A second set of column select lines (e.g., a second total of 64 column select lines) also may be configured to couple with a second page (e.g., second 512 bytes of data) of the set of pages. The second set of column select lines may be dedicated to the second page and therefore may be exclusive of remaining pages of the set of pages.

Decoding components 420 may be associated with sense component clusters 410 and may be configured to couple the sense component clusters 410 with I/O channels (e.g., I/O channels 430). Sense output select lines 425 may provide inputs to the decoding components 420 such that the decoding component 420 may route a portion of the sense component clusters 410 (e.g., logic states of memory cells included in the portion of the sense component clusters 410) to a corresponding portion of I/O channels 430.

I/O channels 430 may be configured to communicate data in and out of the memory array 405 in conjunction with various components (e.g., sense component cluster 410, column select line 415, decoding component 420). In some cases, I/O channel 430 may include multiple individual channels. For example, I/O channel 430 may include four signal paths (which may be referred to as I/O lines) as depicted in the diagram 400.

Further details of a sensing architecture in accordance with aspects of the present disclosure will be described with reference to FIG. 5.

Figure 5:
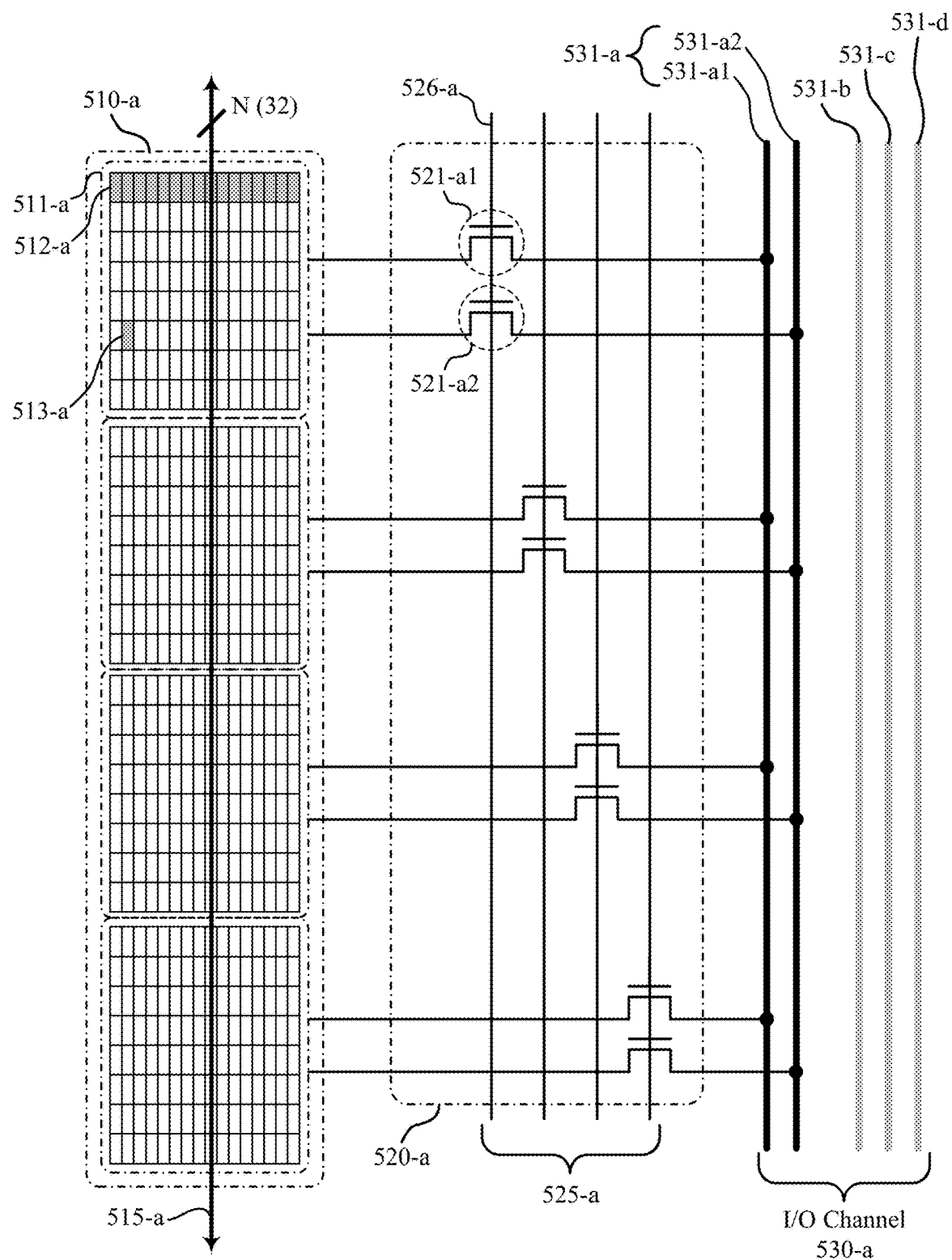

FIG. 5 illustrates an example diagram 500 that supports a sensing architecture in accordance with aspects of the present disclosure. The diagram 500 illustrates further aspects of the diagram 400 as described with reference to FIG. 4 and may depict one of component groups 450 so as to illustrate an output of subset (e.g., 64 bytes) of data. In some cases, the subset of data may be one-eighth of a page of data (e.g., 512 bytes) under the x4 scheme. Other sizes of pages (e.g., 256 bytes, 1024 bytes) may be output using different sizes of subsets of data (e.g., 64 bytes, 512 bytes) under different scheme (e.g., x2 scheme, x8 scheme) of generating a desired or specified granularity of data. Thus, the diagram 500 may correspond to a component group 450 and may include one or more components described herein with reference to FIG. 4. For example, the diagram 400 may include a sense component cluster 510, which may be an example of sense component clusters 410 as described with reference to FIG. 4; column select lines 515, which may be examples of column select lines 415 as described with reference to FIG. 4; a decoding component 520, which may be an example of decoding components 420 as described with reference to FIG. 4; sense output select lines 525, which may be examples of sense output select line 425 as described with reference to FIG. 4; and an I/O channel 530, which may be an example of I/O channels 430 as described with reference to FIG. 4. The following describes aspects of the sensing scheme for accessing 64 bytes of data as part of 512 bytes of data, which may be applicable to additional component groups described with reference to FIG. 4.

Sense component cluster 510-*a* may include one or more sense component groups. In some examples, a sense component cluster 510-*a* may include four (4) sense component groups (e.g., a sense component group 511-*a* being one of the four sense component groups). Further, each sense component group (e.g., sense component group 511-*a*) may include a plurality of sense component blocks. In some examples, a sense component group (e.g., sense component group 511-*a*) may include eight (8) sense component blocks (e.g., a sense component block 512-*a* being one of the eight (8) sense component blocks). Further, each sense component block (e.g., sense component block 512-*a*) may include a plurality of sense components. In some examples, a sense component block (e.g., sense component block 512-*a*) may include sixteen (16) sense components (e.g., a sense component 513-*a* being one of the sixteen (16) sense components). Each sense component (e.g., a sense component 513-*a*) may be configured to access a memory cell (e.g., memory cell 305).

In some cases, the one or more sense component groups (e.g., four (4) sense component groups of sense component cluster 510-*a*) may be coupled with a single page of a set of pages of a memory array (e.g., memory array 405). For example, the sense component cluster 510-*a* may be coupled with a portion (e.g., one-fourth) of the single page, where the sense component cluster 510-*a* may be associated with an output of a subset (e.g., 128 bytes) of data out of the single page of data (e.g., 512 bytes of data). In some cases, each sense component group (e.g., sense component group 511-*a*) may be configured to access the memory cell (e.g., memory cell 305) of the single page using a column select line (e.g., one of column select lines 515-*a*) that may be configured to couple with the single page of the set when the single page is being accessed. In some cases, each sense component (e.g., a sense component 513-*a*) may be configured to access a memory cell (e.g., memory cell 305) of the single page.

In some cases, a controller (e.g., device memory controller 155, local memory controller 165, local memory controller 260, as described with reference to FIGS. 1 and 2) may identify a sense component block of a sense component group for an access operation and select a column select line based on identifying the sense component block, where biasing the column select line to activate a first transistor (e.g., multi-functional switching component 330) is based on selecting the column select line. In some cases, the controller may identify a sense component of the sense component block for the access operation, where the sense component may be configured to access a memory cell of the target page, and where selecting the column select line may be based on identifying the sense component. In some cases, the controller may couple the sense component with an I/O line based on biasing the column select line and biasing an output select line during the access operation.

Column select lines 515-*a* may include multiple column select lines. In some examples, column select lines 515-*a* may include thirty-two (32) column select lines to access a subset of a page of data (e.g., 128 bytes of data). Further, the column select lines 515-*a* may be configured to couple with a single page (e.g., a target page of 512 bytes of data that includes the 128 bytes of data) of the set of pages in the memory array based on the single page being accessed during an access operation. Further, column select lines 515-*a* may be isolated from remaining pages (e.g., non-target pages) of the set of pages, where the remaining pages are different from the single page of the set of pages. For example, the column select lines 515-*a* of the diagram 500 may be configured to couple a quantity of sense components (e.g., sense component 320) that include a subset of a page of data (e.g., logic states of 128 bytes of memory cells) with I/O lines of an I/O channel (e.g., I/O channel 530-*a*).

In some cases, a column select line may be regarded as dedicated to a single page of the set of pages. In such cases, the column select line may be orthogonal to a digit line (e.g., digit line 315 described with reference to FIG. 3) coupled with a memory cell of the single page (e.g., a target page) such that the column select line may be associated with the single page only and isolated from remaining (e.g., untargeted) pages. A column select line parallel to a digit line may couple with the targeted single page and with remaining pages of the set. In some cases, at least one sense component (e.g., sense component 513-*a*) of the set of sense component groups may be located between two adjacent digit lines, where each digit line of the two being orthogonal to the column select line that is associated with the memory cell of the single page. In some cases, the column select line may be coupled with a gate of a column select transistor (e.g., multi-functional switching component 330) that is configured to couple a sense component group of the set of sense component groups with an I/O line of an I/O channel (e.g., I/O channel 530-*a*) through a decoding component (e.g., decoding component 520-*a*). In some cases, a single column select line may couple a single sense component (e.g., e.g., sense component 513-*a*) to a single I/O line (e.g., I/O line 531-*a*).

Decoding component 520-*a* may be configured to couple the sense component cluster 510-*a* with an I/O channel (e.g., I/O channel 530-*a*). I/O channel 530-*a* may include a set of I/O lines (e.g., I/O line 531-*a*, I/O line 531-*b*, I/O line 531-*c*, I/O line 531-*d*). In some cases, each I/O line (e.g., I/O line 531-*a*) may further include a true I/O line (e.g., I/O line 531-*a*1) and a complimentary I/O line (e.g., I/O* line 531-*a*2). Other I/O lines (e.g., I/O line 531-*b*, I/O line 531-*c*, I/O line 531-*d*) each may also be configured to include a true I/O line and a complimentary I/O line although omitted in FIG. 5, in an effort to increase visibility and clarity of the depicted features. Decoding component 520-*a* may include at least one transistor configured to selectively couple at least one sense component group (e.g., sense component group 511-*a*) of the set of sense component groups with at least one I/O line of the I/O channel (e.g., I/O channel 530-*a*) using a sense output select line (e.g., sense output select line 525-*a*). In some cases, the transistor of decoding component 520-*a* (e.g., transistor 521-*a*1, transistor 521-*a*2) may be referred to as a second transistor or a link transistor. Sense output select lines 525-*a* may provide inputs to the decoding component 520-*a* such that the decoding component 520-*a* may selectively couple one sense component group (e.g., sense component group 511-*a*) with one I/O line of the I/O channel. For example, sense output select line 526-*a* may be biased to activate transistor 521-*a* (e.g., transistor 521-*a*1, transistor 521-*a*2) to couple the sense component group 511-*a* with an I/O line 531-*a* (e.g., I/O line 531-*a*1, I/O* line 531-*a*2). In some cases, the sense output select lines 525-*a* may be biased to activate one transistor of the decoding component 520-*a* at a time. In this manner, sense component groups of the sense component cluster (e.g., sense component cluster 510-*a*) may be coupled with an I/O line (e.g., I/O line 531-*a*) at a time through the decoding component 520-*a* in some examples. In other examples, each sense component group of the set of sense component groups may be configured to couple with a different I/O line of an I/O channel.

I/O channel 530-*a* may include multiple individual signal paths or channels (e.g., I/O line 531-*a* through I/O line 531-*d*). In some examples, an I/O line (e.g., I/O line 531-*a*) may be coupled with a sense component group (e.g., sense component group 511-*a*) of a sense component cluster (e.g., sense component cluster 510-*a*) through decoding component (e.g., decoding component 520-*a*) at a time. As such, other I/O lines (e.g., I/O lines 531-*b* through 531-*d*) may be coupled with a sense component group of other sense component clusters (e.g., sense component cluster 410-*b* through sense component cluster 410-*d*), respectively.

In some cases, a controller (e.g., device memory controller 155, local memory controller 165, local memory controller 260, as described with reference to FIGS. 1 and 2) may select a target page from a plurality of pages of a memory array (e.g., memory array 170-*a* described with reference to FIG. 1) for an access operation (e.g., read operation, write operation). The controller may bias, based on selecting the target page, a column select line (e.g., column select line 339, a column select line of column select lines 415-*a* or 515-*a*) to activate a first transistor (e.g., multi-functional switching component 330) coupled with a sense component group of the target page, where the column select line may be coupled with the target page. Further, the controller may bias, based on biasing the column select line, an output select line (e.g., sense output select line 365, one of sense output select lines 425-*a* or 525-*a*) to activate a second transistor (e.g., transistor 521-*a*) that is configured to selectively couple the first transistor (e.g., multi-functional switching component 330) with an input/output (I/O) line. In some cases, the controller may couple the sense component group of a plurality of sense component groups with the I/O line of a plurality of I/O lines based on biasing the column select line and biasing the output select line. Subsequently, the controller may communicate information with the I/O line during the access operation based on biasing the column select line and biasing the output select line.

Figure 6:
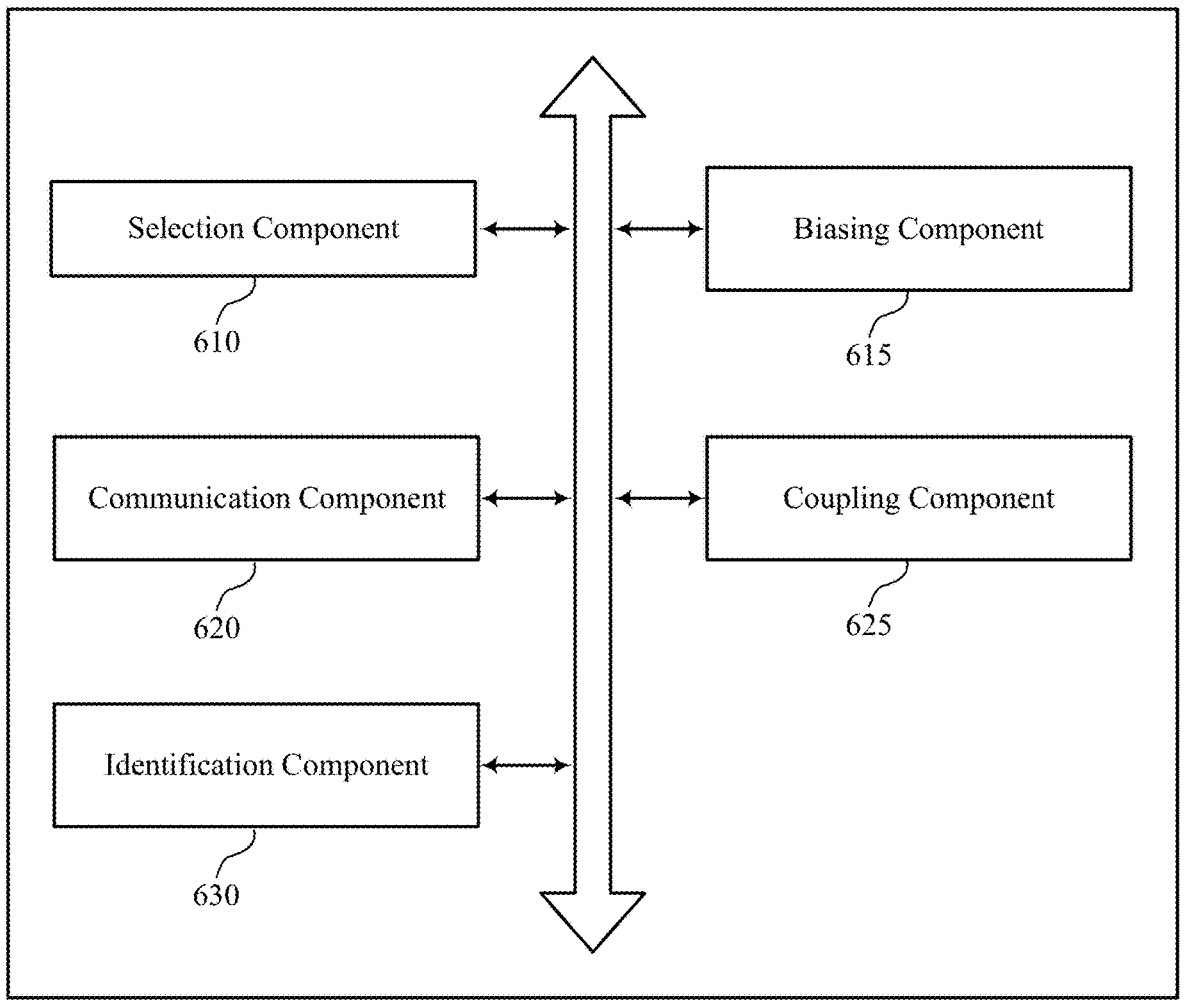
FIG. 6 illustrates an example block diagram of a device that supports a sensing architecture in accordance with aspects of the present disclosure.

FIG. 6 shows an exemplary block diagram 600 of a device 605 that supports a sensing architecture in accordance with aspects of the present disclosure. The device 605 may be an example of aspects of a controller (e.g., device memory controller 155, local memory controller 165, local memory controller 260, as described with reference to FIGS. 1 and 2).

The device 605 may include a selection component 610, a biasing component 615, a communication component 620, a coupling component 625, and an identification component 630. Each of these components may communicate, directly or indirectly, with one another (e.g., via one or more buses).

The selection component 610 may select a target page from a set of pages of a memory array for an access operation. In some cases, the selection component 610 may select an output select line from a second set of lines, where coupling a sense component group with an I/O line may be based on selecting the output select line from the second set of lines, each sense component group of the set of sense component groups configured to couple with each I/O line of the set of I/O lines through a transistor of a set of transistors that comprises a second transistor. In some cases, the selection component 610 may select a column select line from a first set of lines based on identifying a sense component block, where biasing the column select line to activate the first transistor is based on selecting the column select line from the first set of lines.

The biasing component 615 may bias, based on selecting a target page, a column select line to activate a first transistor coupled with a sense component group of the target page, the column select line being coupled with the target page. In some cases, the biasing component 615 may bias, based on biasing the column select line, an output select line to activate a second transistor that is configured to selectively couple the first transistor with an I/O line.

The communication component 620 may communicate information with an I/O line during an access operation based on biasing a column select line and biasing an output select line.

The coupling component 625 may couple a sense component group of a set of sense component groups with an I/O line of a set of I/O lines based on biasing a column select line and biasing an output select line. In some cases, the coupling component 625 may couple a sense component with an I/O line based on biasing the column select line and biasing the output select line during an access operation.

The identification component 630 may identify a sense component block of a sense component group for an access operation. In some cases, the identification component 630 may identify a sense component of the sense component block for the access operation, the sense component configured to access a memory cell of a target page, where selecting a column select line from a first set of lines is based on identifying the sense component.

In some cases, a column select line is coupled with a gate of a first transistor and an output select line is coupled with a gate of a second transistor. In some cases, the first transistor is a column select transistor configured to couple a sense component of a sense component group with an I/O line through the second transistor. In some cases, the second transistor is a link transistor configured to selectively couple the sense component group with the I/O line. In some cases, the column select line may be dedicated to a target page of a set of pages and may be exclusive of non-target pages of the set of pages. In some cases, an access operation may be a read operation or a write operation.

Figure 7:
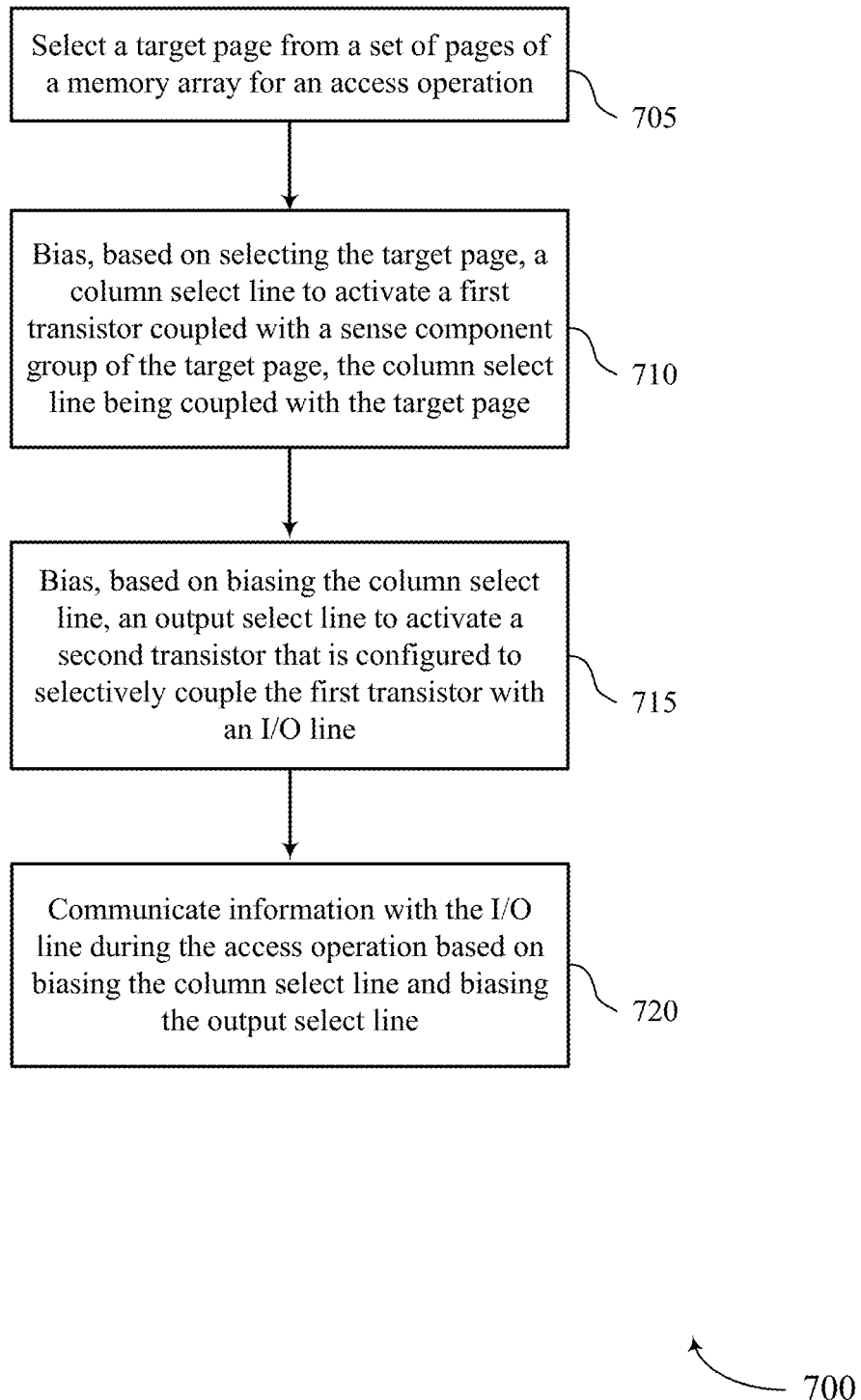
FIGS. 7 and 8 show flowcharts illustrating a method or methods that support a sensing architecture in accordance with aspects of the present disclosure.

FIG. 7 shows a flowchart illustrating a method 700 that supports a sensing architecture in accordance with aspects of the present disclosure. The operations of method 700 may be implemented by a controller or its components as described herein. For example, the operations of method 700 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described herein. Additionally or alternatively, a controller may perform aspects of the functions described herein using special-purpose hardware.

At 705 the controller may select a target page from a set of pages of a memory array for an access operation. In some examples, aspects of the operations of 705 may be performed by a selection component 610 as described with reference to FIG. 6.

At 710 the controller may bias, based on selecting the target page, a column select line to activate a first transistor coupled with a sense component group of the target page, the column select line being coupled with the target page. In some examples, aspects of the operations of 710 may be performed by a biasing component 615 as described with reference to FIG. 6.

At 715 the controller may bias, based on biasing the column select line, an output select line to activate a second transistor that is configured to selectively couple the first transistor with an I/O line. In some examples, aspects of the operations of 715 may be performed by the biasing component 615 as described with reference to FIG. 6.

At 720 the controller may communicate information with the I/O line during the access operation based on biasing the column select line and biasing the output select line. In some examples, aspects of the operations of 720 may be performed by a communication component 620 as described with reference to FIG. 6.

An apparatus for performing a method or methods, such as the method 700, is described. The apparatus may include means for selecting a target page from a set of pages of a memory array for an access operation, means for biasing, based on selecting the target page, a column select line to activate a first transistor coupled with a sense component group of the target page, the column select line being coupled with the target page, means for biasing, based on biasing the column select line, an output select line to activate a second transistor that is configured to selectively couple the first transistor with an I/O line, and means for communicating information with the I/O line during the access operation based on biasing the column select line and biasing the output select line.

Another apparatus for performing a method or methods, such as the method 700, is described. The apparatus may include a memory array and a controller in electronic communication with the memory array, where the controller may be operable to select a target page from a set of pages of the memory array for an access operation, bias, based on selecting the target page, a column select line to activate a first transistor coupled with a sense component group of the target page, the column select line being coupled with the target page, bias, based on biasing the column select line, an output select line to activate a second transistor that is configured to selectively couple the first transistor with an I/O line, and communicate information with the I/O line during the access operation based on biasing the column select line and biasing the output select line.

Some examples of the method 700 and apparatuses described herein may further include processes, features, means, or instructions for coupling the sense component group of a set of sense component groups with the I/O line of a set of I/O lines based on biasing the column select line and biasing the output select line. Some examples of the method 700 and apparatuses described herein may further include processes, features, means, or instructions for selecting the output select line from a second set of lines, where coupling the sense component group with the I/O line is based on selecting the output select line from the second set of lines, each sense component group of the set of sense component groups configured to couple with each I/O line of the set of I/O lines through a transistor of a set of transistors that comprises the second transistor.

In some examples of the method 700 and apparatuses described herein, the column select line is coupled with a gate of the first transistor and the output select line is coupled with a gate of the second transistor. In some examples of the method 700 and apparatuses described herein, the first transistor is a column select transistor configured to couple a sense component of the sense component group with the I/O line through the second transistor. In some examples of the method 700 and apparatuses described herein, the second transistor is a link transistor configured to selectively couple the sense component group with the I/O line. In some examples of the method 700 and apparatuses described herein, the column select line is dedicated to the target page of the set of pages and is exclusive of non-target pages of the set of pages.

Some examples of the method 700 and apparatuses described herein may further include processes, features, means, or instructions for identifying a sense component block of the sense component group for the access operation and means for selecting the column select line from a first set of lines based on identifying the sense component block, where biasing the column select line to activate the first transistor is based on selecting the column select line from the first set of lines. Some examples of the method 700 and apparatuses described herein may further include processes, features, means, or instructions for identifying a sense component of the sense component block for the access operation, the sense component configured to access a memory cell of the target page, where selecting the column select line from the first set of lines is based on identifying the sense component. Some examples of the method 700 and apparatuses described herein may further include processes, features, means, or instructions for coupling the sense component with the I/O line based on biasing the column select line and biasing the output select line during the access operation. In some examples of the method 700 and apparatuses described herein, the access operation is a read operation or a write operation.

Figure 8:
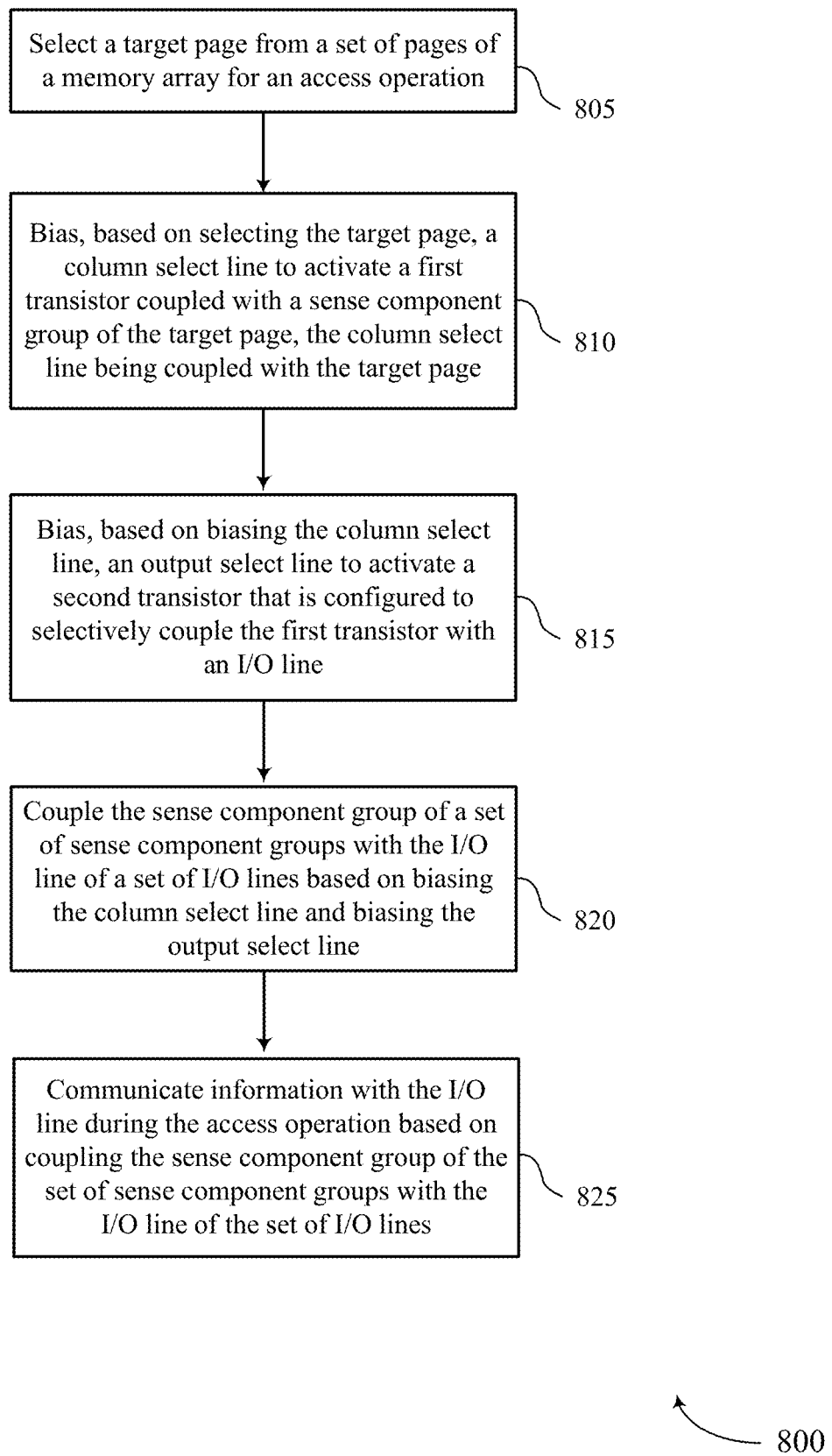

FIG. 8 shows a flowchart illustrating a method 800 that supports a sensing architecture in accordance with aspects of the present disclosure. The operations of method 800 may be implemented by a controller or its components as described herein. For example, the operations of method 800 may be performed by a controller (e.g., device memory controller 155, local memory controller 165, local memory controller 260, as described with reference to FIGS. 1 and 2). In some examples, a controller may execute a set of instructions to control the functional elements of the memory array to perform the functions described herein. Additionally or alternatively, a controller may perform aspects of the functions described herein using special-purpose hardware.

At 805 the controller may select a target page from a set of pages of a memory array for an access operation. In some examples, aspects of the operations of 705 may be performed by a selection component 610 as described with reference to FIG. 6.

At 810 the controller may bias, based on selecting the target page, a column select line to activate a first transistor coupled with a sense component group of the target page, the column select line being coupled with the target page. In some examples, aspects of the operations of 810 may be performed by a biasing component 615 as described with reference to FIG. 6.

At 815 the controller may bias, based on biasing the column select line, an output select line to activate a second transistor that is configured to selectively couple the first transistor with an I/O line. In some examples, aspects of the operations of 815 may be performed by the biasing component 615 as described with reference to FIG. 6.

At 820 the controller may couple the sense component group of a set of sense component groups with the I/O line of a set of I/O lines based on biasing the column select line and biasing the output select line. In some examples, aspects of the operations of 820 may be performed by the coupling component 625 as described with reference to FIG. 6.

At 825 the controller may communicate information with the I/O line during the access operation based on coupling the sense component group of the set of sense component groups with the I/O line of the set of I/O lines. In some examples, aspects of the operations of 825 may be performed by a communication component 620 as described with reference to FIG. 6.

An apparatus for performing a method or methods, such as the method 800, is described. The apparatus may include means for selecting a target page from a set of pages of a memory array for an access operation, means for biasing, based on selecting the target page, a column select line to activate a first transistor coupled with a sense component group of the target page, the column select line being coupled with the target page, means for biasing, based on biasing the column select line, an output select line to activate a second transistor that is configured to selectively couple the first transistor with an I/O line, means for coupling the sense component group of a set of sense component groups with the I/O line of a set of I/O lines based on biasing the column select line and biasing the output select line, and means for communicating information with the I/O line during the access operation based on coupling the sense component group of the set of sense component groups with the I/O line of the set of I/O lines.

Another apparatus for performing a method or methods, such as the method 800, is described. The apparatus may include a memory array and a local memory controller in electronic communication with the memory array, where the local memory controller may be operable to select a target page from a set of pages of a memory array for an access operation, bias, based on selecting the target page, a column select line to activate a first transistor coupled with a sense component group of the target page, the column select line being coupled with the target page, bias, based on biasing the column select line, an output select line to activate a second transistor that is configured to selectively couple the first transistor with an I/O line, couple the sense component group of a set of sense component groups with the I/O line of a set of I/O lines based on biasing the column select line and biasing the output select line, and communicate information with the I/O line during the access operation based on coupling the sense component group of the set of sense component groups with the I/O line of the set of I/O lines.

It should be noted that the methods described herein describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device, comprising:
   a memory array comprising a plurality of pages that each comprise a memory cell;
   a column select line that is configured to couple with a single page of the plurality of pages via a first transistor based at least in part on the single page being accessed;
   a plurality of sense component groups coupled with the single page of the plurality of pages, each sense component group of the plurality of sense component groups configured to access the memory cell of the single page using the column select line and determine a logic state of the memory cell; and
   a second transistor coupled with a node and configured to couple the node with an input/output (I/O) line of an I/O channel during at least a portion of an access operation associated with the memory cell and a precharge voltage source during a different portion of the access operation, wherein the node is between a sense component of a sense component group of the plurality of sense component groups and the I/O line of the I/O channel.

2. The device of claim 1, further comprising:
   a decoding component configured to couple a sense component group of the plurality of sense component groups with the I/O line of the I/O channel.

3. The device of claim 2, wherein the decoding component comprises at least one transistor configured to selectively couple at least one sense component group of the plurality of sense component groups with at least one I/O line of the I/O channel using a sense output select line.

4. The device of claim 2, wherein the I/O line of the I/O channel is configured to couple with a voltage source to precharge a node of the single page during a read operation via the second transistor.

5. The device of claim 1, wherein each sense component group of the plurality of sense component groups is configured to couple with a different input/output (I/O) line of the I/O channel.

6. The device of claim 1, wherein the column select line is isolated from remaining pages of the plurality of pages, the remaining pages being different from the single page of the plurality of pages.

7. The device of claim 6, wherein the remaining pages are untargeted pages that are not accessed during the access operation.

8. The device of claim 1, further comprising:
   a plurality of column select lines configured to couple with the single page of the plurality of pages, the plurality of column select lines comprising the column select line, wherein the plurality of column select lines is isolated from remaining pages of the plurality of pages.

9. The device of claim 1, further comprising:
   a first plurality of column select lines configured to couple with a first page of the plurality of pages and exclusive of remaining pages of the plurality of pages; and
   a second plurality of column select lines configured to couple with a second page of the plurality of pages and exclusive of remaining pages of the plurality of pages.

10. The device of claim 1, wherein each sense component group of the plurality of sense component groups is configured to couple with the input/output (I/O) line of the I/O channel through the second transistor of a plurality of transistors, wherein the second transistor is associated with a sense output select line of a plurality of sense output select lines.

11. The device of claim 1, wherein the column select line is dedicated to the single page of the plurality of pages and orthogonal to a digit line that is coupled with the memory cell of the single page.

12. The device of claim 1, wherein at least one sense component of the plurality of sense component groups is located between two adjacent digit lines, each digit line of the two being orthogonal to the column select line that is associated with the memory cell of the single page.

13. The device of claim 1, wherein the column select line is coupled with a gate of a column select transistor that is configured to couple a sense component group of the plurality of sense component groups with the input/output (I/O) line of the I/O channel through a decoding component.

14. The device of claim 1, wherein:
    each sense component group of the plurality of sense component groups comprises a plurality of sense component blocks; and
    each sense component block of the plurality of sense component blocks comprises a plurality of sense components, each sense component of the plurality of sense components configured to access the memory cell of the single page.

15. A method, comprising:
    selecting a target page from a plurality of pages of a memory array for an access operation;

biasing, based at least in part on selecting the target page, a column select line to activate a first transistor coupled with a first node that is coupled with a sense component group of the target page, the column select line being coupled with the target page, wherein each sense component of the sense component group is configured to determine a logic state of a memory cell of the target page;

biasing, based at least in part on biasing the column select line, an output select line to activate a second transistor that is configured to selectively couple the first transistor with an input/output (I/O) line via a second node electrically positioned between the first transistor and the second transistor; and communicating information with the I/O line during the access operation based at least in part on biasing the column select line and biasing the output select line.

16. The method of claim 15, further comprising:
coupling the sense component group of a plurality of sense component groups with the I/O line of a plurality of I/O lines based at least in part on biasing the column select line and biasing the output select line.

17. The method of claim 16, further comprising:
selecting the output select line from a second plurality of lines, wherein coupling the sense component group with the I/O line is based at least in part on selecting the output select line from the second plurality of lines, each sense component group of the plurality of sense component groups configured to couple with each I/O line of the plurality of I/O lines through a transistor of a plurality of transistors that comprises the second transistor.

18. The method of claim 15, wherein the column select line is coupled with a gate of the first transistor and the output select line is coupled with a gate of the second transistor.

19. The method of claim 15, wherein the first transistor is a column select transistor configured to couple a sense component of the sense component group with the I/O line through the second transistor.

20. The method of claim 15, wherein the second transistor is a link transistor configured to selectively couple the sense component group with the I/O line.

21. The method of claim 15, wherein the column select line is dedicated to the target page of the plurality of pages and is exclusive of non-target pages of the plurality of pages.

22. The method of claim 15, further comprising:
identifying a sense component block of the sense component group for the access operation; and
selecting the column select line from a first plurality of lines based at least in part on identifying the sense component block, wherein biasing the column select line to activate the first transistor is based at least in part on selecting the column select line from the first plurality of lines.

23. The method of claim 22, further comprising:
identifying a sense component of the sense component block for the access operation, the sense component configured to access the memory cell of the target page, wherein selecting the column select line from the first plurality of lines is based at least in part on identifying the sense component.

24. The method of claim 23, further comprising:
coupling the sense component with the I/O line based at least in part on biasing the column select line and biasing the output select line during the access operation.

25. The method of claim 15, wherein the access operation is a read operation or a write operation.

26. An apparatus, comprising:
a memory array comprising a plurality of pages; and
a controller coupled with the memory array, the controller configured to cause the apparatus to:
select a target page from the plurality of pages of the memory array for an access operation;
bias, based at least in part on selecting the target page, a column select line to activate a first transistor coupled with a first node that is coupled with a sense component group of the target page, the column select line being coupled with the target page, wherein each sense component of the sense component group is configured to determine a logic state of a memory cell of the target page;
bias, based at least in part on biasing the column select line, an output select line to activate a second transistor that is configured to selectively couple the first transistor with an input/output (I/O) line via a second node electrically positioned between the first transistor and the second transistor; and
communicate information with the I/O line during the access operation based at least in part on biasing the column select line and biasing the output select line.

* * * * *